(12) United States Patent
Andreev et al.

(10) Patent No.: US 7,415,691 B2
(45) Date of Patent: Aug. 19, 2008

(54) METHOD AND SYSTEM FOR OUTPUTTING A SEQUENCE OF COMMANDS AND DATA DESCRIBED BY A FLOWCHART

(75) Inventors: Alexander E. Andreev, San Jose, CA (US); Andrey A. Nikitin, Moscow (RU); Ranko Scepanovic, Saratoga, CA (US)

(73) Assignee: LSI Corporation, Milpitas, CA (US)

( * ) Notice: Subject to any disclaimer, the term of this patent is extended or adjusted under 35 U.S.C. 154(b) by 843 days.

(21) Appl. No.: 10/894,781

(22) Filed: Jul. 20, 2004

(65) Prior Publication Data

US 2006/0020927 A1   Jan. 26, 2006

(51) Int. Cl.
*G06F 17/50* (2006.01)
(52) U.S. Cl. ............... 716/17; 716/1; 716/6; 716/18
(58) Field of Classification Search ............. 716/1, 716/6, 17, 18
See application file for complete search history.

(56) References Cited

U.S. PATENT DOCUMENTS 6,016,255 A * 1/2000 Bolan et al. ............ 361/807

* cited by examiner

*Primary Examiner*—Thuan Do
(74) *Attorney, Agent, or Firm*—Suiter Swantz PC LLO

(57) ABSTRACT

The present invention is a method and system for outputting a sequence of commands and data described by a flowchart. In an exemplary aspect of the present invention, a method for outputting a sequence of commands and data described by a flowchart includes steps as follows. A flowchart describing a sequence of commands and data is received. The flowchart includes a plurality of flowchart symbols. Each of the plurality of flowchart symbols is assigned a ROM (read only memory) record. Assigned ROM records are stored in a ROM. A module (e.g., a CKD, or the like) is generated to include the ROM, wherein the module receives as input a CLOCK signal, a RESET signal, an ENABLE signal and N binary inputs $x_1, x_2, \ldots x_N$, and outputs the sequence of commands and data.

20 Claims, 4 Drawing Sheets

METHOD AND SYSTEM FOR OUTPUTTING A SEQUENCE OF COMMANDS AND DATA DESCRIBED BY A FLOWCHART

FIELD OF THE INVENTION

The present invention generally relates to the field of integrated circuits, particularly to a method and system for outputting a sequence of commands and data described by a flowchart.

BACKGROUND OF THE INVENTION

Platform-based IC (integrated circuit) design is a powerful concept for coping with the increased pressure on time-to-market, design and manufacturing costs encountered in the current IC market. A platform is a large-scale, high-complexity semiconductor device that includes one or more of the following elements: (1) memory; (2) a customizable array of transistors; (3) an IP (intellectual property) block; (4) a processor, e.g., an ESP (embedded standard product); (5) an embedded programmable logic block; and (6) interconnect. RapidChip™ developed by LSI Logic Corp. is an instance of a platform. The basic idea behind the platform-based design is to avoid designing and manufacturing a chip from scratch. Some portion of the chip's architecture is predefined for a specific type of application. Through extensive design reuse, the platform-based design may provide faster time-to-market and reduce design cost.

Under a platform approach, there are two distinct steps entailed in creating a final end-user product: a prefabrication step and a customization step. In a prefabrication step, a slice is built on a wafer. A slice is a pre-manufactured chip in which all silicon layers have been built, leaving the metal layers or top metal layers to be completed with the customer's unique IP. For example, RapidSlice™ developed by LSI Logic Corp. is an instance of a slice. One or more slices may be built on a single wafer. It is understood that a slice may include one or more bottom metal layers or may include no metal layers at all. In a preferred embodiment of the prefabrication step, portions of the metal layers are pre-specified to implement the pre-defined blocks of the platform and the diffusion processes are carried out in a wafer fab. The base characteristics, in terms of the IP, the processors, the memory, the interconnect, the programmable logic and the customizable transistor array, are all pre-placed in the design and pre-diffused in the slice. However, a slice is still fully decoupled because the customer has not yet introduced the function into the slice. In a customization step, the customer-designed function is merged with the pre-defined blocks and the metal layers (or late-metal components) are laid down, which couple the elements that make up the slice built in the wafer fab, and the customizable transistor array is configured and given its characteristic function. In other embodiments, early-metal steps may be part of the pre-fabricated slice to reduce the time and cost of the customization step, resulting in a platform which is more coupled and specific. It is understood that a prefabrication step and a customization step may be performed in different foundries. For example, a slice may be manufactured in one foundry. Later, in a customization step, the slice may be pulled from inventory and metalized, which gives the slice its final product characteristics in a different foundry.

A slice such as RapidSlice™ may contain several RRAMs (Reconfigurable RAMs, or Redundant RAMs, or RapidSlice™ RAMs). Each RRAM is a set of memories of the same type that are placed compactly. RRAMs include built-in testing and self-repairing components. The process of testing memories of RRAMs and self-repairing these memories is managed by a RRAM controller, which receives a sequence of commands and data output by a control kernel device (CKD). The CKD is a device that has N binary inputs: $x_1, x_2, \ldots x_N$, and 2 wide outputs: command and data. The CKD may produce as output a specific sequence of commands and data. These commands and data are then sent to other devices for further processing.

Under a platform approach, RRAMs, the RRAM controller, and the CKD are typically pre-diffused in a slice. Since different customers may use RRAMs differently, it is thus desirable to provide a CKD that includes as few variable components as possible. That is, it is desirable to have a CKD where the change of the sequence of commands and data to be output by the CKD may not lead to the global change of the CKD already diffused in the slice.

SUMMARY OF THE INVENTION

In a first exemplary aspect of the present invention, a method for outputting a sequence of commands and data described by a flowchart includes steps as follows. A flowchart describing a sequence of commands and data is received. The flowchart includes a plurality of flowchart symbols. Each of the plurality of flowchart symbols is assigned a ROM (read only memory) record. Assigned ROM records are stored in a ROM. A module (e.g., a CKD, or the like) is generated to include the ROM, wherein the module receives as input a CLOCK signal, a RESET signal, an ENABLE signal and N binary inputs $x_1, x_2, \ldots x_N$, and outputs the sequence of commands and data.

In a further exemplary aspect of the present invention, a method for constructing a control device kernel for outputting a sequence of commands and data described by a flowchart includes steps as follows. A control device kernel including a ROM is diffused in a slice. The control device kernel is connected to a RRAM controller in the slice. A flowchart describing a sequence of commands and data is received. The flowchart includes a plurality of flowchart symbols. Each of the plurality of flowchart symbols is assigned a ROM record. The ROM records are stored in the ROM. The control device kernel outputs the sequence of commands and data to the RRAM controller for managing a process of testing and self-repairing memories of RRAMs, which are communicatively coupled to the RRAM controller.

In another exemplary aspect of the present invention, a system for outputting a sequence of commands and data described by a flowchart includes a ROM for storing ROM records. The ROM records are assigned to flowchart symbols, which are used by a flowchart to describe or define a sequence of commands and data. The system further includes a logic module for receiving the ROM records from the ROM and outputting the sequence of commands and data. The logic module is communicatively coupled to the ROM.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
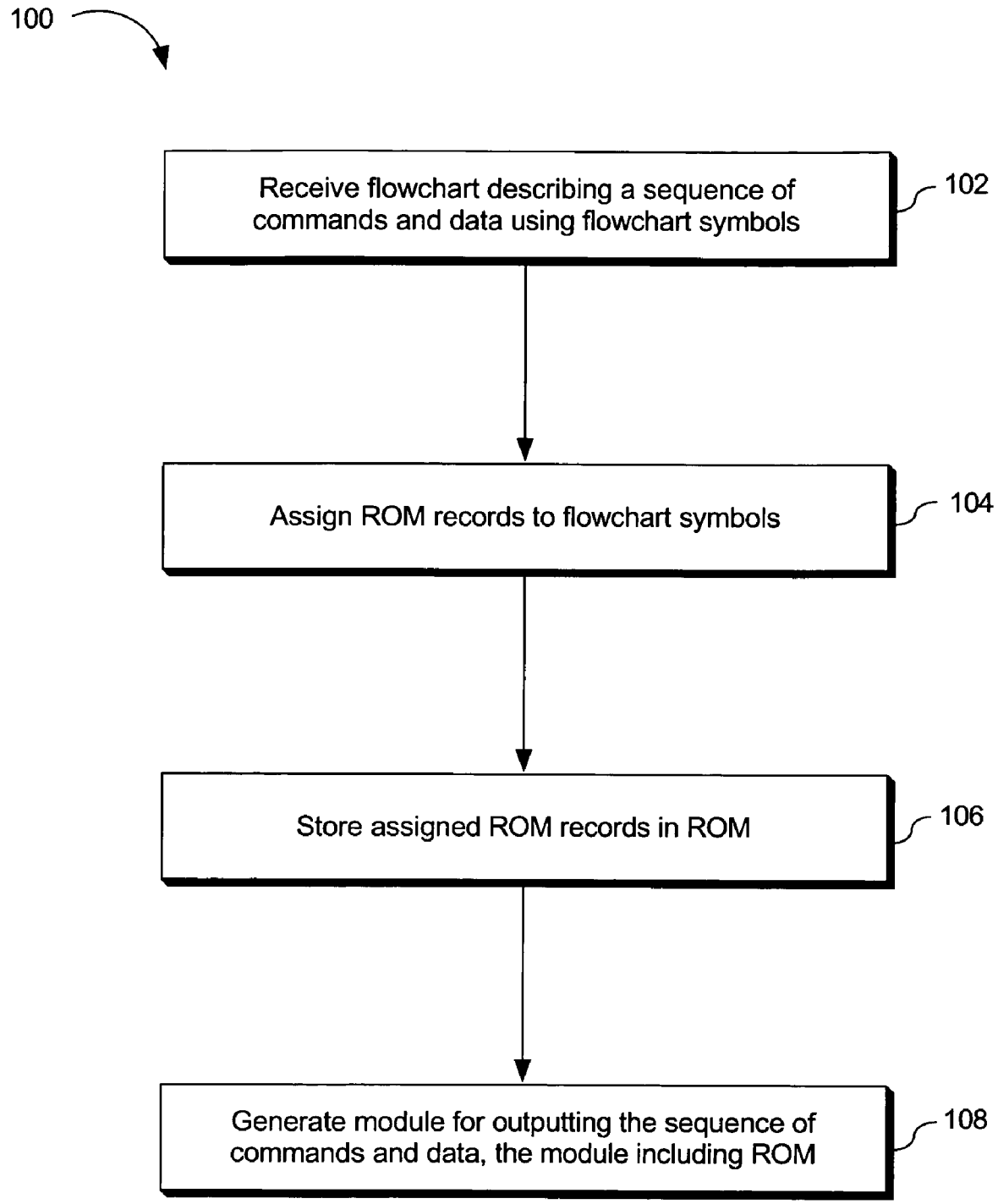
FIG. 1 is a flow diagram showing a method for outputting a sequence of commands and data described by a flowchart in accordance with an exemplary embodiment of the present invention.

FIG. 1 is a flow diagram showing a method 100 for outputting a sequence of commands and data described by a flowchart in accordance with an exemplary embodiment of the present invention. The method 100 may start with step 102 in which a flowchart describing a sequence of commands and data is received. The flowchart includes a plurality of flowchart symbols. In a preferred embodiment, the flowchart symbols includes: command and data, jump, optional jump, start finish, start subflowchart, call subflowchart, and finish subflowchart. The command and data symbol contains 2 values: command and data desired to be output at a given step. The jump symbol contains the link to the flowchart symbol to be processed next after the current symbol. The optional jump symbol has the link to the flowchart symbol to be processed next after the current symbol if some condition is valid. The condition may be either if $(x_k)$ or if $(!x_k)$. The start and finish symbols indicate the start and end of the process. The start symbol must be the first symbol of the flowchart. The flowchart may include some subflowcharts. Each subflowchart starts with the symbol start subflowchart and finishes with the symbol finish subflowchart. The subflowchart may be called from any place of the flowchart and may be called from any other subflowchart. Let M be the maximal depth of the subflowchart call stack. Below is an example of a flowchart describing a sequence of commands and data:

1. start
2. command 1, data 2
3. command 1, data 3
4. if $(x_1)$ goto 8
5. if $(!x_2)$ goto 8
6. call subflowchart1
7. call subflowchart1
8. finish
9. start subflowchart1
10. call subflowchart2
11. call subflowchart2
12. finish subflowchart1
13. start subflowchart2
14. command 2, data 3
15. command 3, data 4
16. finish subflowchart2

The foregoing-indicated exemplary flowchart has 2 inputs: $x_1$ and $x_2$. The maximal call stack depth M=3. If the values of inputs $x_1$, and $x_2$ are 0 and 1, respectfully, then the sequence of commands and data described by the flowchart is: (1,2), (1,3), (2,3), (2,4), (2,3), (2,4), (2,3), (2,4), (2,3), (2,4). Otherwise, sequence is (1,2), (1,3).

Still referring to FIG. 1, each of the plurality of flowchart symbols is assigned a ROM (read only memory) record 104. The ROM record may be assigned as follows:

1) for symbol start 000;
2) for symbol start subflowchart: 000;
3) for symbol command and data: 001<command value><data value>;
4) for symbol jump: 010<jump address>;
5) for symbol optional jump: 011<jump address><neg flag><input_index)>, where <neg flag>=1 if optional jump has a condition if($!x_i$), <neg flag>=0 if optional jump has a condition if ($x_i$), and <input index> is the index "i" of the input placed inside the condition;
6) for symbol call subflowchart: 100<address>, where <address> is the address of the symbol start subflowchart for the corresponding subflowchart;
7) for symbol finish subflowchart: 101; and
8) for symbol finish: 010<address>, where <address> is the address of the given flowchart symbol finish. It means that when one reaches the finish symbol one stops at this symbol forever (if the signal RESET does not appear).

Figure 3:
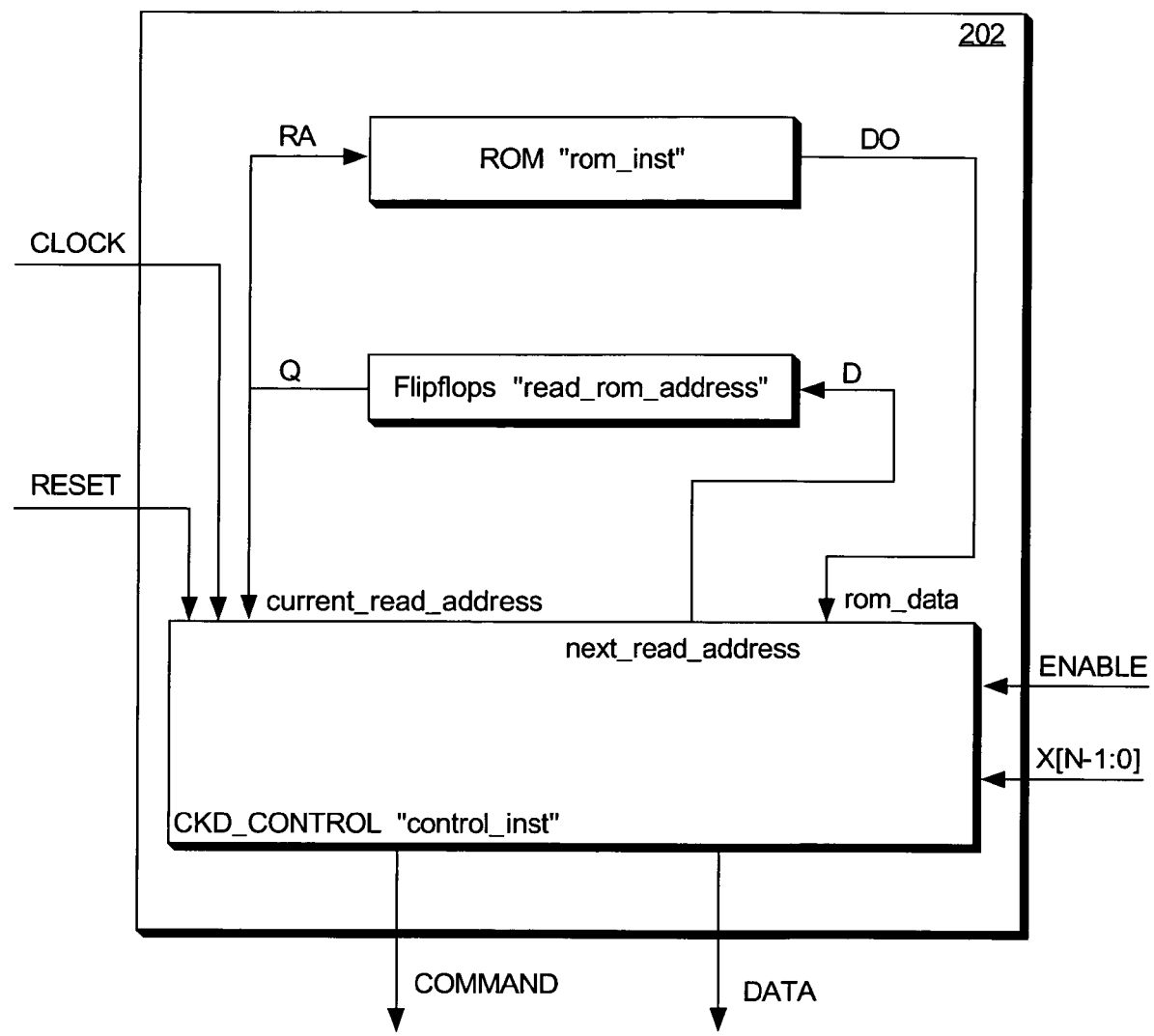
FIG. 3 shows an exemplary internal structure of the control kernel device shown in FIG. 3 in accordance with an exemplary embodiment of the present invention.

Assigned ROM records are stored in a ROM (see, e.g., FIG. 3) 106. It is possible that the ROM record assigned for a flowchart symbol may have a bit size that is less than a width RW of the ROM. In this case, preferably at least one zero is appended to the end of the ROM record in order to obtain the size RW.

Figure 2:
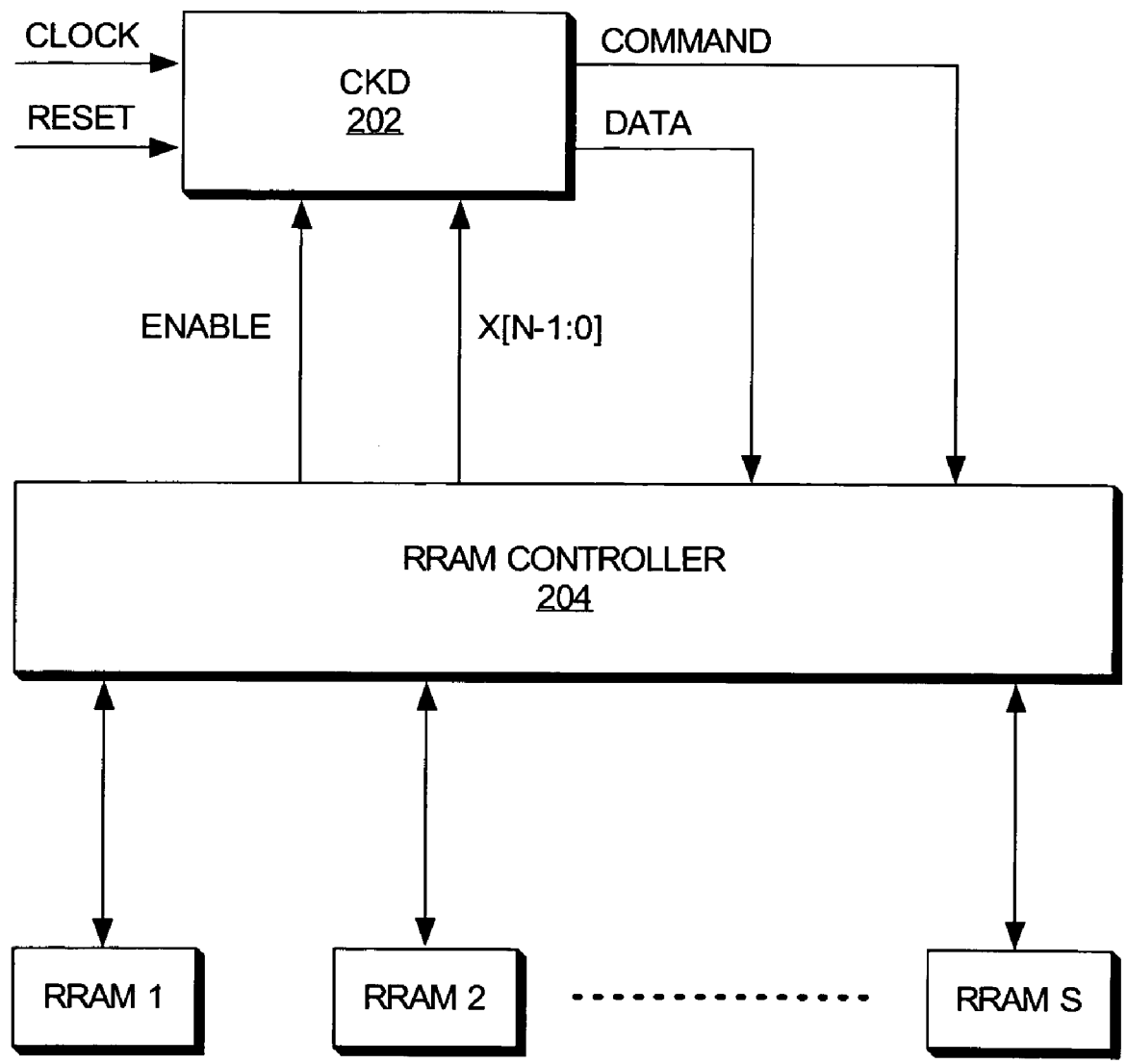
FIG. 2 is a simplified schematic diagram showing a system for outputting a sequence of commands and data described by a flowchart in accordance with an exemplary embodiment of the present invention, where the system includes a control kernel device and a RRAM controller.

A module is generated to include the ROM, wherein the module receives as input a CLOCK signal, a RESET signal, an ENABLE signal and N binary inputs $x_1, x_2, \ldots x_N$, and outputs the sequence of commands and data 108. The module may be a CKD (see, e.g., CKD 202 in FIGS. 2 and 3) that generates the sequence of commands and data described by the flowchart to a RRAM controller (see, e.g., RRAM controller 204 in FIG. 2). Alternatively, the module may be any device that sends control commands and data to another device for further processing. Let N be the maximal number of inputs of the flowchart, let M>=1 be the maximal depth of the subflowchart call stack, let S be the maximal number of symbols in the flowchart, let CS be the bit width of the output command, and let DS be the bit width of the output data. The module created includes the ROM and logical cells and flip-flops. Denote RW as a ROM width (or the bit size of words stored in this ROM). The capacity (number of stored words) of this ROM is S (i.e., the maximal number of flowchart symbols). Assign RW=3+max (CS+DS, $\log_2 S+\log_2 N+1$) (Throughout the present application, the notation $\log_2 A$ refers to the smallest integer number that is not less than $\log_2 A$). The module may have some additional ports: input CLOCK, input RESET, and input ENABLE. The inputs CLOCK and RESET are the clock and reset inputs that drive all flipflops and ROM of the module, the input ENABLE is used for temporarily halting the work of the module. If ENABLE==0, then the work of the module is halted. The module may be described in a hardware description language.

The following is a description of a CKD architecture (see, e.g., CKD 202 in FIG. 3) in a hardware description language similar to Verilog:

```
module CKD(CLOCK, RESET, ENABLE, X, COMMAND, DATA)
    input CLOCK, RESET, ENABLE;
    input [N-1:0] X;
    output [CS-1:0] COMMAND;
    output [DS-1:0] DATA;
    reg [log2CS-1:0] read_rom_address;
    wire [RW-1:0] rom_data;
    ROM rom_inst (.RA(read_rom_address), .DO(rom_data));
    CKD_CONTROL control_inst (.ENABLE(ENABLE), .X(X),
        .COMMAND(COMMAND), .DATA(DATA),
        .current_read_address(read_rom_address),
        .rom_data(rom_data),
        .next_read_address(read_rom_address));
endmodule
```

As shown, the module CKD contains 2 instances: the instance "rom_inst" of the ROM and the instance "control_inst" of a logical module CKD_CONTROL (see, e.g., FIG. 3) that processes the data "rom_data" read from the ROM and generates the "read_rom_address".

The logical module CKD_CONTROL contains logics and flipflop "call stack" and is described as follows:

```
module CKD_CONTROL(ENABLE, X, COMMAND, DATA,
current_read_address, rom_data, next_read_address)
    input ENABLE;
    input [N-1:0] X;
    output [CS-1:0] COMMAND;
    output [DS-1:0] DATA;
    input [log2CS-1:0] current_read_address;
    input [RW-1:0] rom_data;
    output [log2CS-1:0] next_read_address;
    wire [2:0] symbol_type;
    wire [CS-1:0] command_value;
    wire [DS-1:0] data_value;
    wire [log2CS-1:0] jump_address;
    wire neg_flag;
    wire [log2N-1:0] input_index;
    assign symbol_type = rom_data[2:0];
    assign command_value = rom_data[CS+2 : 3];
    assign data_value = rom_data[DS+CS+2 : CS+3];
    assign jump_address = rom_data[log2CS+2 : 3];
    assign neg_flag = rom_data[log2CS+3 : log2CS+3];
    assign input_index = rom_data[log2N+log2CS+3 : log2CS+4];
    wire selected_X, selected_neg_X;
    CKD_SELECTOR select_inst(.X(X), .index(input_index),
        .Z(selected_X));
    assign selected_neg_X = selected_X ^ neg_flag;
    assign COMMAND = ENABLE &
    (symbol_type===3'b001) &
        command_value;
    assign DATA = ENABLE & (symbol_type===3'b001) & data_value;
    wire need_make_jump, need_make_return, need_make_call;
    assign need_make_call = (symbol_type===3'b100);
    assign need_make_jump = (symbol_type===3'b010) |
    need_make_call |
        ((symbol_type===3'b011)&(selected_neg_X));
    assign need_make_return = (symbol_type===3'b101);
    reg [log2CS-1:0] call_stack_1;
    reg [log2CS-1:0] call_stack_2;
    ......
    reg [log2CS-1:0] call_stack_M;
    assign next_read_address = ((~ENABLE) & current_read_address) |
        (ENABLE & need_make_jump & jump_address) |
        (ENABLE & need_make_return & (call_stack_1+1)) |
        (ENABLE&(~need_make_return)&(~need_make_jump)&
        (current_read_address+1));
    if (M > 1) {
      assign call_stack_1 = ( need_make_call & current_read_address ) |
        ( need_make_return & call_stack_2 ) |
        ( (~need_make_call) & (~need_make_return) & call_stack_1 );
      assign call_stack_2 = ( need_make_call & call_stack_1 ) |
        ( need_make_return & call_stack_3 ) |
        ( (~need_make_call) & (~need_make_return) & call_stack_2 );
      ........
      assign call_stack_M-1 = ( need_make_call & call_stack_M-2 ) |
        ( need_make_return & call_stack_M ) |
        ( (~need_make_call) & (~need_make_return) &
        call_stack_M-1 );
      assign call_stack_M = ( need_make_call & call_stack_M-1 ) |
        ( (~need_make_call) & call_stack_M );
    }
    else if (M==1) {
      assign call_stack_1 = ( need_make_call & current_read_address ) |
        ( (~need_make_call) & call_stack_1 );
    }
endmodule
```

The values of wires "symbol_type", "command_value", "data_value", "jump_address", "neg_flag", "input_index" are assigned in accordance with the rules of storing the flowchart symbols into the ROM. The value of wire "selected_X" is equal to the value of the input X[input_index]. The module CKD_SELECTOR is a multiplexor that selects the element of array "X" with index "index". The value of the wire "selected_neg_X" is obtained by taking into account the flag "neg_flag". The values of wires "need_make_jump," "need_make_return" and "need_make_call" is equal to 1 if and only if one processes jump, finishes the process of subflowchart and starts the process of subflowchart, respectfully. The registers "call_stack_1", "call_stack_2", . . . , "call_stack_M" stores the subflowchart call stack addresses.

It is understood that the foregoing-indicated descriptions in the hardware description language not only describes a CKD architecture used for a RRAM controller, but can also be used to define an architecture for a device that sends control commands and data to other devices without departing from the scope and spirit of the present invention.

Thus, the present invention provides a method and system for creating a CKD based on a given flowchart defining a sequence of commands and data. The variable part of the created CKD is the data (ROM records) stored in the ROM, while all other parts of the CKD remain constant. As a result, when the flowchart changes, only the data stored in the ROM needs to be changed. The present CKD can thus be pre-diffused in a slice to provide a sequence of commands and data to a RRAM controller also pre-diffused in the same slice. When a customer wishes to change the sequence of commands and data to be output by the CKD, the customer only needs to change the data stored in the ROM of the CKD, and does not require a global change to the CKD.

Figure 4:
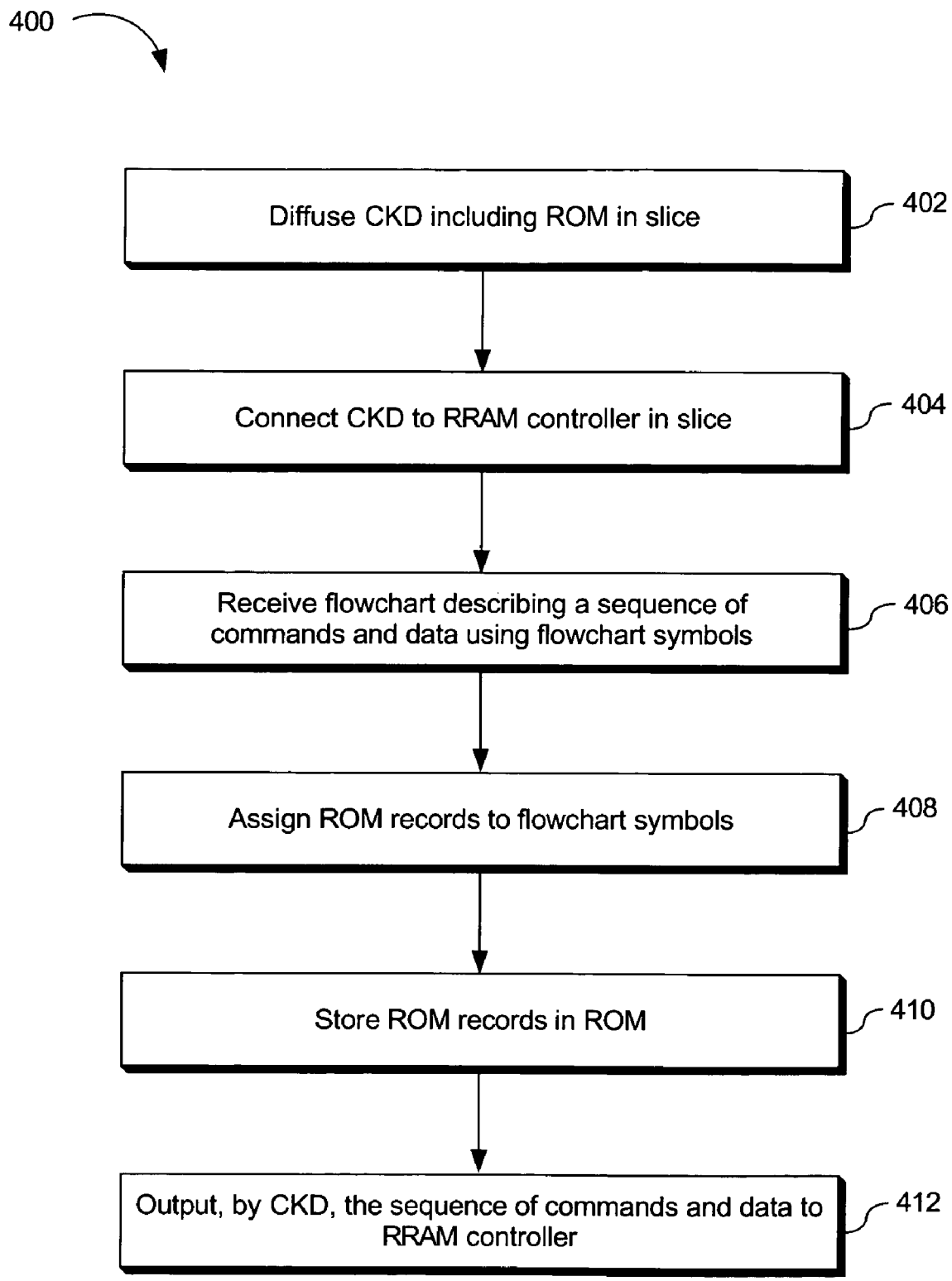
FIG. 4 is a flow diagram showing a method for constructing a control device kernel for outputting a sequence of commands and data described by a flowchart in accordance with an exemplary embodiment of the present invention.

FIG. 4 is a flow diagram showing a method 400 for constructing a control device kernel for outputting a sequence of commands and data described by a flowchart in accordance with an exemplary embodiment of the present invention. The method 400 may start with step 402 in which a control device kernel including a ROM is diffused in a slice 402. The control device kernel may have an internal architecture shown in FIG. 3 and may be described by the foregoing hardware description language. The slice is a pre-manufactured chip in which all silicon layers have been built, leaving the metal layers or top metal layers to be completed with the customer's unique IP. For example, RapidSlice™ developed by LSI Logic Corp. is an instance of a slice. The control device kernel is connected to a RRAM controller also diffused in the slice 404. A flowchart describing a sequence of commands and data is received 406. The flowchart may be provided by a customer. The flowchart includes a plurality of flowchart symbols. Each of the plurality of flowchart symbols is assigned a ROM record 408. The ROM records are stored in the ROM 410. The control device kernel outputs the sequence of commands and data to the RRAM controller for managing a process of testing and self-repairing memories of RRAMs, which are communicatively coupled to the RRAM controller 412.

It is to be noted that the above described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of software package. Such a software package may be a computer program product which employs a storage medium including stored computer code which is used to program a computer to perform the disclosed function and process of the present invention. The storage medium may include, but is not limited to, any type of conventional floppy disks, optical disks, CD-ROMS, magneto-optical disks, ROMs, RAMs, EPROMs, EEPROMs, magnetic or optical cards, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for outputting a sequence of commands and data described by a flowchart, comprising:
   receiving a flowchart describing a sequence of commands and data, said flowchart including a plurality of flowchart symbols of an integrated circuit;
   assigning a ROM record for each of said plurality of flowchart symbols;
   storing assigned ROM records in a ROM; and
   generating a module including said ROM,
   wherein said module receives as input a CLOCK signal, a RESET signal, an ENABLE signal and N binary inputs $x_1, x_2, \ldots x_N$, and outputs said sequence of commands and data.

2. The method of claim 1, wherein said module is a control kernel device, and said control kernel device receives as input said ENABLE signal and said N binary inputs $x_1, x_2, \ldots x_N$ from a RRAM controller and outputs said sequence of commands and data to said RRAM controller.

3. The method of claim 2, wherein said RRAM controller manages a process of testing and self-repairing memories of RRAMs, said RRAMs being communicatively coupled to said RRAM controller.

4. The method of claim 1, wherein said plurality of flowchart symbols include command and data, jump, optional jump, start, finish, start subflowchart, call subflowchart, and finish subflowchart.

5. The method of claim 4, wherein said ROM records are assigned as follows:
   (a) for symbol start: 000;
   (b) for symbol start subflowchart: 000;
   (c) for symbol command and data: 001<command value><data value>;
   (d) for symbol jump: 010<jump address>;
   (e) for symbol optional jump: 011<jump address><neg flag><input_index>, where <neg flag>=1 if optional jump has a condition if ($!x_i$), <neg flag>=0 if optional jump has a condition if($x_i$), and <input index> is the index "i" of the input placed inside the condition;
   (f) for symbol call subflowchart: 100<address>, where <address> is the address of the symbol start subflowchart for the corresponding subflowchart;
   (g) for symbol finish subflowchart: 101; and
   (h) for symbol finish: 010<address>, where <address> is the address of the given flowchart symbol finish.

6. The method of claim 5, wherein when one of said ROM records has a bit size less than a width of said ROM, at least one zero is appended to an end of said one of said ROM records to obtain said width of said ROM.

7. The method of claim 1, wherein said generating comprises defining an architecture of said module in a hardware description language as follows:

```
module CKD(CLOCK, RESET, ENABLE, X, COMMAND, DATA)
  input CLOCK, RESET, ENABLE;
  input [N-1:0] X;
  output [CS-1:0] COMMAND;
  output [DS-1:0] DATA;
  reg [log2CS-1:0] read_rom_address;
  wire [RW-1:0] rom_data;
  ROM rom_inst (.RA(read_rom_address), .DO(rom_data));
  CKD_CONTROL control_inst (.ENABLE(ENABLE), .X(X),
    .COMMAND(COMMAND), .DATA(DATA),
    .current_read_address(read_rom_address), .rom_data(rom_data),
    .next_read_address(read_rom_address));
endmodule
```

```
module CKD_CONTROL(ENABLE, X, COMMAND, DATA,
current_read_address, rom_data, next_read_address)
  input ENABLE;
  input [N-1:0] X;
  output [CS-1:0] COMMAND;
  output [DS-1:0] DATA;
  input [log2CS-1:0] current_read_address;
  input [RW-1:0] rom_data;
  output [log2CS-1:0] next_read_address;
  wire [2:0] symbol_type;
  wire [CS-1:0] command_value;
  wire [DS-1:0] data_value;
  wire [log2CS-1:0] jump_address;
  wire neg_flag;
  wire [log2N-1:0] input_index;
  assign symbol_type = rom_data[2:0];
  assign command_value = rom_data[CS+2 : 3];
  assign data_value = rom_data[DS+CS+2 : CS+3];
  assign jump_address = rom_data[log2CS+2 : 3];
  assign neg_flag = rom_data[log2CS+3.: log2CS+3];
  assign input_index = rom_data[log2N+log2CS+3 : log2CS+4];
  wire selected_X, selected_neg_X;
  CKD_SELECTOR select_inst(.X(X), .index(input_index),
    .Z(selected_X));
```

-continued

```
assign selected_neg_X = selected_X ^ neg_flag;
assign COMMAND = ENABLE & (symbol_type===3'b001) &
   command_value;
assign DATA=ENABLE & (symbol_type===3'b001) & data_value;
wire need_make_jump, need_make_return, need_make_call;
assign need_make_call = (symbol_type===3'b100);
assign need_make_jump = (symbol_type===3'b010) |
   need_make_call |
   ((symbol_type===3'b011)&(selected_neg_X));
assign need_make_return = (symbol_type===3'b101);
reg [log2CS-1:0] call_stack_1;
reg [log2CS-1:0] call_stack_2;
......
reg [log2CS-1:0] call_stack_M;
assign next_read_address = ((~ENABLE) & current_read_address) |
   (ENABLE & need_make_jump & jump_address) |
   (ENABLE & need_make_return & (call_stack_1+1)) |
   (ENABLE&(~need_make_return)&(~need_make_jump)&
      (current_read_address+1));
if (M > 1) {
   assign call_stack_1 = ( need_make_call &
   current_read_address ) |
      ( need_make_return & call_stack_2 ) |
      ( (~need_make_call) & (~need_make_return) & call_stack_1 );
   assign call_stack_2 = ( need_make_call & call_stack_1 ) |
      ( need_make_return & call_stack_3 ) |
      ( (~need_make_call) & (~need_make_return) & call_stack_2 );
   ..........
   assign call_stack_M-1 = ( need_make_call & call_stack_M-2 ) |
      ( need_make_return & call_stack_M ) |
      ( (~need_make_call) & (~need_make_return) &
      call_stack_M-1 );
   assign call_stack_M = ( need_make_call & call_stack_M-1 ) |
      ( (~need_make_call) & call_stack_M );
}
else if (M==1) {
   assign call_stack_1 = ( need_make_call &
   current_read_address ) |
      ( (~need_make_call) & call_stack_1 );
}
endmodule.
```

8. A computer-readable medium having computer-executable instructions for performing a method for outputting a sequence of commands and data described by a flowchart, said method comprising:

receiving a flowchart describing a sequence of commands and data, said flowchart including a plurality of flowchart symbols of an intergrated circuit;

assigning a ROM record for each of said plurality of flowchart symbols;

storing assigned ROM records in a ROM; and generating a module including said ROM, wherein said module receives as input a CLOCK signal, a RESET signal, an ENABLE signal and N binary inputs $x_1, x_2, \ldots x_N$, and outputs said sequence of commands and data.

9. The computer-readable medium of claim 8, wherein said module is a control kernel device, and said control kernel device receives as input said ENABLE signal and said N binary inputs $x_1, x_2, \ldots x_N$ from a RRAM controller and outputs said sequence of commands and data to said RRAM controller.

10. The computer-readable medium of claim 9, wherein said RRAM controller manages a process of testing and self-repairing memories of RRAMs, said RRAMs being communicatively coupled to said RRAM controller.

11. The computer-readable medium of claim 8, wherein said plurality of flowchart symbols include command and data, jump, optional jump, start, finish, start subflowchart, call subflowchart, and finish subflowchart.

12. The computer-readable medium of claim 11, wherein said ROM records are assigned as follows:

(a) for symbol start: 000;

(b) for symbol start subflowchart: 000;

(c) for symbol command and data: 001<command value><data value>;

(d) for symbol jump: 010<jump address>;

(e) for symbol optional jump: 011<jump address><neg flag><input_index>, where <neg flag>=1 if optional jump has a condition if (!$x_i$), <neg flag>=0 if optional jump has a condition if ($x_i$), and <input index> is the index "i" of the input placed inside the condition;

(f) for symbol call subflowchart: 100<address>, where <address> is the address of the symbol start subflowchart for the corresponding subflowchart;

(g) for symbol finish subflowchart: 101; and (h) for symbol finish: 010<address>, where <address> is the address of the given flowchart symbol finish.

13. The computer-readable medium of claim 12, wherein when one of said ROM records has a bit size less than a width of said ROM, at least one zero is appended to an end of said one of said ROM records to obtain said width of said ROM.

14. The computer-readable medium of claim 8, wherein said generating comprises defining an architecture of said module in a hardware description language as follows:

```
module CKD(CLOCK, RESET, ENABLE, X, COMMAND, DATA)
   input CLOCK, RESET, ENABLE;
   input [N-1:0] X;
   output [CS-1:0] COMMAND;
   output [DS-1:0] DATA;
   reg [log2CS-1:0] read_rom_address;
   wire [RW-1:0] rom_data;
   ROM rom_inst (.RA(read_rom_address), .DO(rom_data));
   CKD_CONTROL control_inst (.ENABLE(ENABLE), .X(X),
      .COMMAND(COMMAND), .DATA(DATA),
      .current_read_address(read_rom_address), .rom_data(rom_data),
      .next_read_address(read_rom_address));
endmodule
```

```
module CKD_CONTROL(ENABLE, X, COMMAND, DATA,
current_read_address, rom_data, next_read_address)
   input ENABLE;
   input [N-1:0] X;
   output [CS-1:0] COMMAND;
   output [DS-1:0] DATA;
   input [log2CS-1:0] current_read_address;
   input [RW-1:0] rom_data;
   output [log2CS-1:0] next_read_address;
   wire [2:0] symbol_type;
   wire [CS-1:0] command_value;
   wire [DS-1:0] data_value;
   wire [log2CS-1:0] jump_address;
   wire neg_flag;
   wire [log2N-1:0] input_index;
   assign symbol_type = rom_data[2:0];
   assign command_value = rom_data[CS+2 : 3];
   assign data_value = rom_data[DS+CS+2 : CS+3];
   assign jump_address = rom_data[log2CS+2 : 3];
   assign neg_flag = rom_data[log2CS+3 : log2CS+3];
   assign input_index = rom_data[log2N+log2CS+3 : log2CS+4];
   wire selected_X, selected_neg_X;
   CKD_SELECTOR select_inst(.X(X), .index(input_index),
   .Z(selected_X));
   assign selected_neg_X = selected_X ^ neg_flag;
   assign COMMAND = ENABLE & (symbol_type===3'b001) &
   command_value;
   assign DATA= ENABLE & (symbol_type===3'b001) & data_value;
   wire need_make_jump, need_make_return, need_make_call;
```

-continued

```
assign need_make_call = (symbol_type===3'b100);
assign need_make_jump = (symbol_type===3'b010) |
need_make_call |
    ((symbol_type===3'b011)&(selected_neg_X));
assign need_make_return = (symbol_type===3'b101);
reg [log2CS-1:0] call_stack_1;
reg [log2CS-1:0] call_stack_2;
......
reg [log2CS-1:0] call_stack_M;
assign next_read_address = ((~ENABLE) & current_read_address) |
    (ENABLE & need_make_jump & jump_address) |
    (ENABLE & need_make_return & (call_stack_1+1)) |
    (ENABLE&(~need_make_return)&(~need_make_jump)&
        (current_read_address+1));
if (M > 1) {
    assign call_stack_1 = ( need_make_call &
    current_read_address ) |
        ( need_make_return & call_stack_2 ) |
        ( (~need_make_call) & (~need_make_return) & call_stack_1 );
    assign call_stack_2 = ( need_make_call & call_stack_1 ) |
        ( need_make_return & call_stack_3 ) |
        ( (~need_make_call) & (~need_make_return) & call_stack_2 );
    ........
    assign call_stack_M-1 = ( need_make_call & call_stack_M-2 ) |
        ( need_make_return & call_stack_M ) |
        ( (~need_make_call) & (~need_make_return) &
        call_stack_M-1 );
    assign call_stack_M = ( need_make_call & call_stack_M-1 ) |
        ( (~need_make_call) & call_stack_M );
}
else if (M==1) {
    assign call_stack_1 = ( need_make_call &
    current_read_address ) |
        ( (~need_make_call) & call_stack_1 );
}
endmodule.
```

15. A method for constructing a control device kernel for outputting a sequence of commands and data described by a flowchart, comprising:

diffusing a control device kernel in a slice, said control device kernel including a ROM of an intergrated circuit;

connecting said control device kernel to a RRAM controller in said slice;

receiving a flowchart describing a sequence of commands and data, said flowchart including a plurality of flowchart symbols;

assigning ROM records to said plurality of flowchart symbols;

storing said ROM records in said ROM;

outputting, by said control device kernel, said sequence of commands and data to said RRAM controller for managing a process of testing and self-repairing memories of RRAMs, said RRAMs being communicatively coupled to said RRAM controller.

16. A system for outputting a sequence of commands and data described by a flowchart, comprising:

a ROM for storing ROM records, said ROM records being assigned to flowchart symbols of a control device kernel of an intergrated circuit, said flowchart symbols being included in a flowchart describing a sequence of commands and data; and a logic module, communicatively coupled to said ROM, for receiving said ROM records from said ROM and outputting said sequence of commands and data.

17. The system of claim 16, wherein said logic module receives as input a CLOCK signal, a RESET signal, an ENABLE signal and N binary inputs $x_1, x_2, \ldots x_N$.

18. The system of claim 17, further comprises a RRAM controller for providing said ENABLE signal and said N binary inputs $x_1, x_2, \ldots x_N$ to said logic module and for receiving said sequence of commands from said logic module, wherein said RRAM controller manages a process of testing and self-repairing memories of RRAMs, said RRAMs being communicatively coupled to said RRAM controller.

19. The system of claim 16, wherein said flowchart symbols include command and data, jump, optional jump, start finish, start subflowchart, call subflowchart, and finish subflowchart.

20. The system of claim 19, wherein said ROM records are assigned as follows:

(a) for symbol start 000;

(b) for symbol start subflowchart 000;

(c) for symbol command and data: 001<command value><data value>;

(d) for symbol jump: 010<jump address>;

(e) for symbol optional jump: 011<jump address><neg flag><input_index>, where <neg flag>=1 if optional jump has condition if($!x_i$), <neg flag>=0 if optional jump has condition if ($x_i$), and <input index> is the index "i" of the input placed inside the condition;

(f) for symbol call subflowchart: 100<address>, where <address> is the address of the symbol start subflowchart for the corresponding subflowchart;

(g) for symbol finish subflowchart: 101; and (h) for symbol finish: 010<address>, where <address> is the address of the given flowchart symbol finish.

* * * * *